United States Patent
Panigrahi et al.

(10) Patent No.: US 8,291,364 B2
(45) Date of Patent: *Oct. 16, 2012

(54) AUTOMATED DIGITAL CIRCUIT DESIGN TOOL THAT REDUCES OR ELIMINATES ADVERSE TIMING CONSTRAINTS DO TO AN INHERENT CLOCK SIGNAL SKEW, AND APPLICATIONS THEREOF

(75) Inventors: Avishek Panigrahi, Sunnyvale, CA (US); Soumya Banerjee, San Jose, CA (US); Thomas Stephen Chanak, Jr., Saratoga, CA (US)

(73) Assignee: MIPS Technologies, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/027,917

(22) Filed: Feb. 15, 2011

(65) Prior Publication Data
US 2011/0138349 A1 Jun. 9, 2011

Related U.S. Application Data

(63) Continuation of application No. 11/976,713, filed on Oct. 26, 2007, now Pat. No. 7,917,882.

(51) Int. Cl.
*G06F 17/50* (2006.01)
*H01L 25/00* (2006.01)
*H03K 19/00* (2006.01)

(52) U.S. Cl. ........ 716/122; 716/108; 716/113; 716/134; 326/41; 326/47; 326/101; 326/93

(58) Field of Classification Search .................. 716/108, 716/113, 122, 134; 326/41, 47, 101, 93
See application file for complete search history.

(56) References Cited

U.S. PATENT DOCUMENTS

| | | | | |
|---|---|---|---|---|
| 5,235,521 A * | 8/1993 | Johnson et al. | ................. | 326/96 |
| 5,452,239 A * | 9/1995 | Dai et al. | ......................... | 703/19 |
| 5,923,188 A * | 7/1999 | Kametani et al. | ............... | 326/93 |
| 6,836,877 B1 * | 12/2004 | Dupenloup | .................... | 716/103 |
| 7,082,582 B1 * | 7/2006 | Borkovic et al. | ............. | 716/103 |
| 7,185,300 B2 * | 2/2007 | Frenkil | ........................ | 716/108 |
| 7,587,686 B1 * | 9/2009 | Schleicher, II | ................ | 716/100 |
| 7,779,372 B2 * | 8/2010 | Campbell et al. | ................ | 716/114 |
| 7,917,882 B2 * | 3/2011 | Panigrahi et al. | ............. | 716/134 |
| 2001/0029599 A1 * | 10/2001 | Minami et al. | .................... | 716/6 |
| 2003/0140318 A1 * | 7/2003 | Kitahara et al. | .................. | 716/1 |
| 2004/0021485 A1 * | 2/2004 | Kanazawa | ...................... | 326/83 |
| 2006/0066357 A1 * | 3/2006 | Inoue | ................................ | 326/93 |
| 2008/0216040 A1 * | 9/2008 | Furnish et al. | .................. | 716/10 |
| 2008/0301594 A1 * | 12/2008 | Jiang et al. | ...................... | 716/2 |
| 2009/0254874 A1 * | 10/2009 | Bose | ................................ | 716/6 |

* cited by examiner

*Primary Examiner* — Phallaka Kik
(74) *Attorney, Agent, or Firm* — Sterne, Kessler, Goldstein & Fox P.L.L.C.

(57) ABSTRACT

The present invention provides an automated digital circuit design tool that reduces or eliminates adverse timing constraints due to an inherent clock signal skew, and applications thereof In an embodiment, an automated design tool according to the invention generates a clocking system that includes a clock signal generator, control logic, enable logic, and at least one clock gater. The clock signal generator generates a clock signal that is distributed to various logic blocks of the digital circuit using a buffered clock tree. The enable logic receives input values from the control logic and provides a control signal to the clock gater. When enabled, the clock gater allows a clock signal to pass through to multiple registers. An early clock signal is provided to register(s) in the control logic, which allows for an increased clock frequency while still meeting timing constraints.

7 Claims, 9 Drawing Sheets

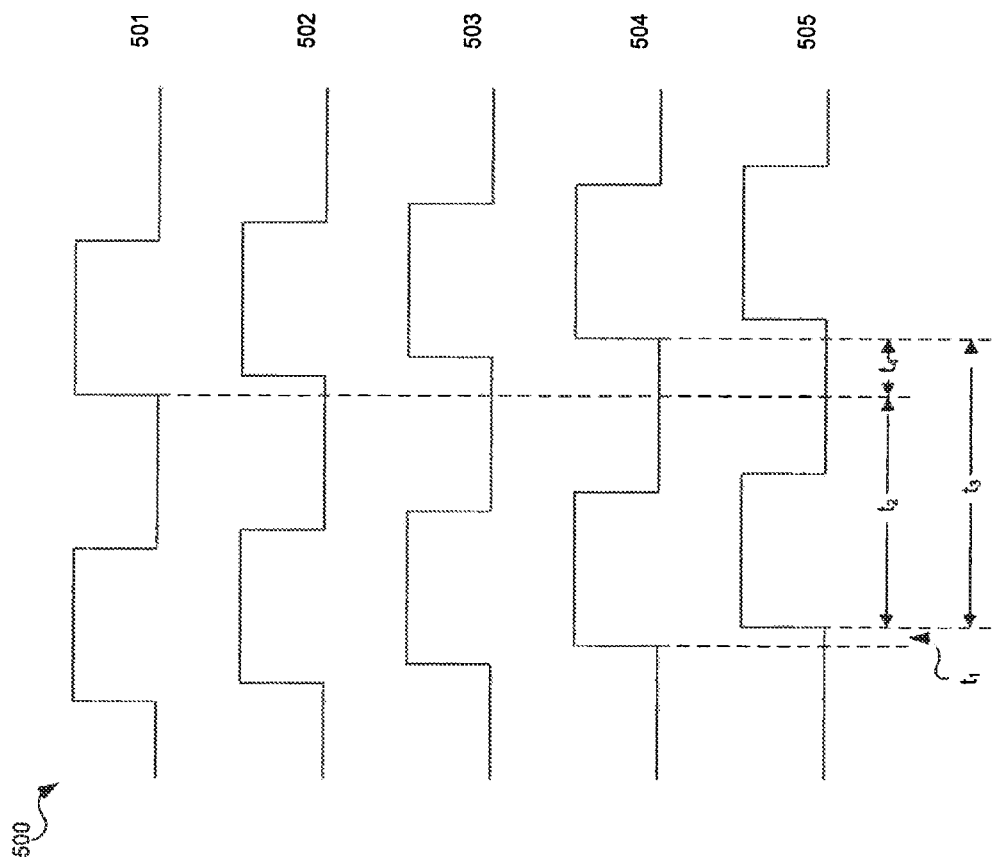

US 8,291,364 B2

AUTOMATED DIGITAL CIRCUIT DESIGN TOOL THAT REDUCES OR ELIMINATES ADVERSE TIMING CONSTRAINTS DO TO AN INHERENT CLOCK SIGNAL SKEW, AND APPLICATIONS THEREOF

This application is a continuation of allowed U.S. patent application Ser. No. 11/976,713 filed on Oct. 26, 2007, which is incorporated herein by reference in its entirety.

FIELD OF THE PRESENT INVENTION

The present invention generally relates to digital circuits. More particularly, it relates to an automated digital circuit design tool, and applications thereof.

BACKGROUND OF THE PRESENT INVENTION

A high-speed digital circuit such as, for example, a microprocessor includes a large number of registers that synchronize operation of the circuit. Ideally, these registers should be clocked at the same instance in time in order to maintain synchronization. In order to accomplish this, such circuits include a complex buffered clock tree that routes a clock signal from a clock source to the registers. Typically, the farther a register is from the clock source, the more clock insertion delay there is due to delays in the routing of the clock signal.

Conventional automated circuit design tools, such as synthesis place-and-route computer software, take clock insertion delay into account and produce clocking systems in which the clock latency through the clock tree is balanced to all registers. In these design tools, any differences in clock latency through the clock tree are undesirable and treated as noise. As a result, there is an inherent clock signal skew that occurs in digital circuits that include clock gaters. Clock gaters are used, for example, to inhibit operation of selected blocks of logic elements when the blocks are not needed, thereby conserving power and/or reducing heat generation. A secondary effect of clock gaters may be to buffer the clock signal (e.g., to restore strength to the clock signal so that it can drive multiple synchronizing registers).

The inherent clock signal skew that arises in digital circuits designed using conventional automated circuit design tools occurs because the enable pins of clock gaters are driven by synchronizing registers that receive the same clock signal as all the other registers in the circuit. But in order to perform their functions, clock gaters must be designed such that they are schematically or logically between the clock source and the registers they drive. The magnitude of this inherent clock signal skew is proportional, for example, to the routing delay between the clock input of a clock gater and the clock input of registers the clock gater drives. In a high-speed digital circuit, this inherent clock signal skew can be a critical timing path for the digital circuit and thereby make it impossible to automatically synthesize the digital circuit using conventional design tools.

What are needed are new design tools and techniques that overcome the deficiencies noted above and which are able to automatically synthesis digital circuits having clock gaters in which the clock insertion delay is large compared to the cycle time.

BRIEF SUMMARY OF THE PRESENT INVENTION

The present invention provides an automated digital circuit design tool. that reduces or eliminates adverse timing constraints due to an inherent clock signal skew, and applications thereof In an embodiment, an automated digital circuit design tool according to the present invention generates a clocking system that includes a clock signal generator, control logic, enable logic, and one or more clock gaters.

In an embodiment, the clock signal generator generates a clock signal that is distributed to various logic blocks of the digital circuit using a buffered clock tree, The enable logic receives input values from the control logic and provides control signals to the dock gaters. When enabled, the clock gaters may allow clock signals to pass through to multiple buffers. The multiple buffers, in turn, drive multiple registers or synchronizing elements. When disabled, the clock gaters may prevent clock signals from passing through to the multiple buffers and the multiple registers or synchronizing elements. Early clock signals are provided to registers in the control logic, which allows for an increased clock frequency while still meeting timing, constraints. The present invention is used, for example, to automatically determine and implement the early clock signals.

It is a feature of the present invention that it can be used to design digital circuits that include clock gaters with clock frequencies such that the clock period is smaller than the clock insertion time. Frequency is an important metric of performance for a digital circuit.

Further embodiments, features, and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the present invention and to enable a person skilled in the pertinent art to make and use the present invention.

FIG. 5 is a timing diagram tor an example clocking system.

The present invention is described with reference to the accompanying drawings. The drawing in which an element first appears is typically indicated by the leftmost digit or digits in the corresponding reference number.

DETAILED DESCRIPTION OF THE PRESENT INVENTION

The present invention provides an automated digital circuit design tool that reduces or eliminates adverse timing constraints due to an inherent clock signal skew, and applications thereof. In the detailed description of the present invention that follows, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In an embodiment, a digital circuit designed in accordance with the present invention has a clocking system that includes a clock signal generator, control logic, enable logic, and one or more clock gaters. The clock signal generator generates a clock signal that is distributed to the various logic blocks of the digital circuit using a buffered clock tree.

The enable logic receives input values from control logic registers and provides control signals to the clock gaters. When enabled, the clock gaters may allow clock signals to pass through to multiple buffers. The multiple buffers, in turn, may strengthen the clock signal as it continues on to multiple registers or synchronizing elements. When disabled, the clock gaters may prevent clock signals from passing through to the multiple buffers and the multiple registers or synchronizing elements. As used herein, the terms "registers" and/or "synchronizing elements" include flip-flops, latches, Muller C-Elements, etc.

Early clock signals are provided to control logic registers to allow for an increased clock frequency while still meeting timing constraints. The present invention is used, for example, to automatically determine and implement the early clock signals.

Figure 1:
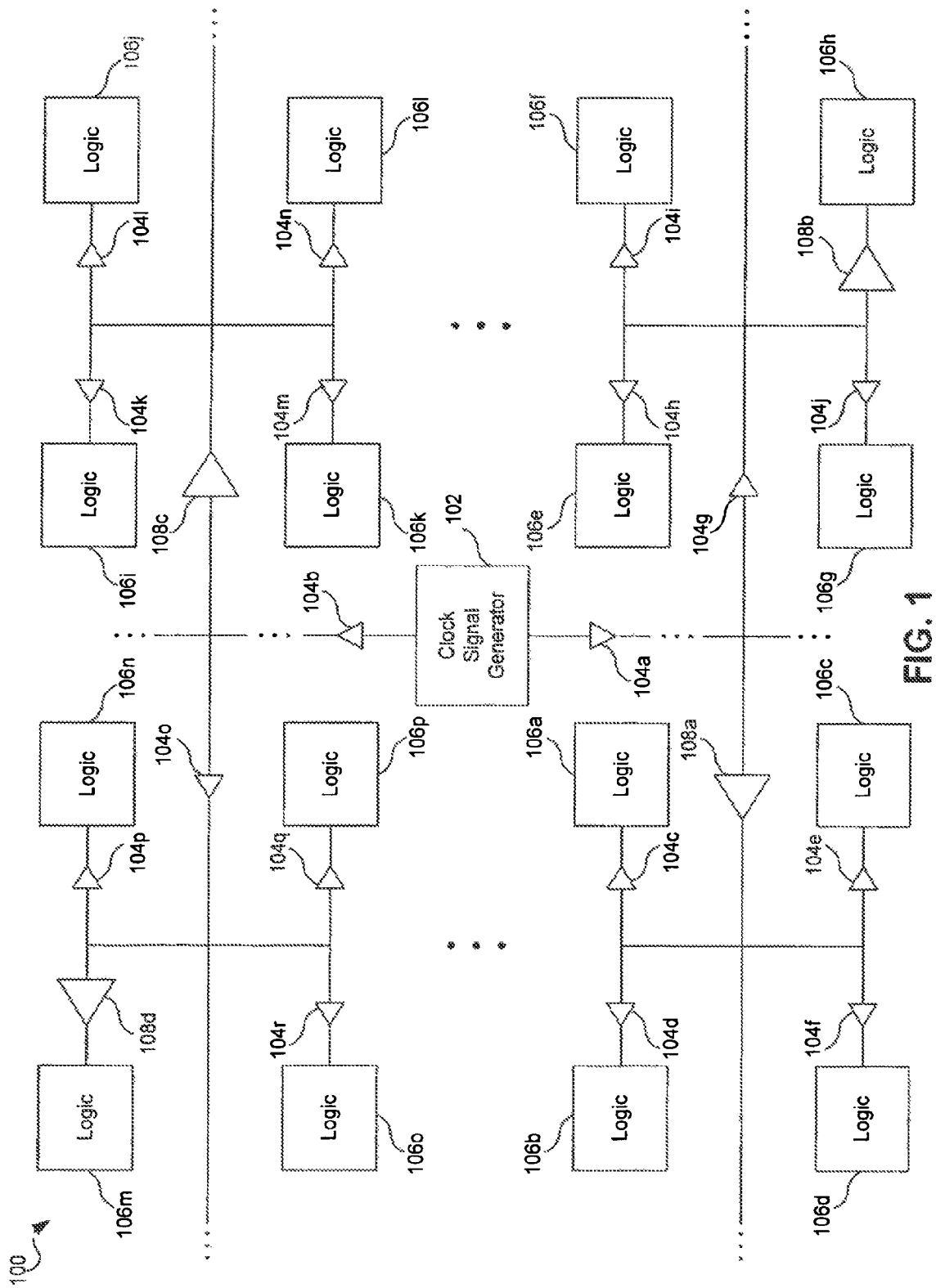
FIG. 1 is a diagram of an example clock tree in a digital circuit designed according to an embodiment of the present invention.

FIG. 1 is a diagram of an exemplary clocking system 100 used with a digital circuit according to an embodiment of the present invention. As described herein, the present invention can be used to design and implement any digital circuit, for example, that includes a clocking system in which the clock latency through the clock tree is comparable to the clock period of the clocking system. In an embodiment, clocking system 100 is designed using an automated design tool according to the present invention.

As shown in FIG. 1, clocking system 100 includes a clock signal generator 102 that generates a clock signal that passes through the clock distribution tree to logic blocks 106a-p. In an embodiment, the clock tree includes buffers 104a-r and clock gaters 108a-d, which separate clock signal generator 102 from logic blocks 106a-p.

Buffers 104a-r may serve to strengthen a degrading clock signal between clock signal generator 102 and logic blocks 106a-p. Buffers 104a-r may also be used to introduce clock signal delay. The delay from clock signal generator 102 to any logic block 106a-p is preferably equal or close to equal. Clock gaters 108a-d may allow or prevent a clock signal from passing through. In an embodiment, clock gaters 108a-d control the clock signal to one logic block 106a-p. In an alternate embodiment, clock gaters 108a-d control the clock signal to a plurality of logic blocks 106a-p.

Figure 2:
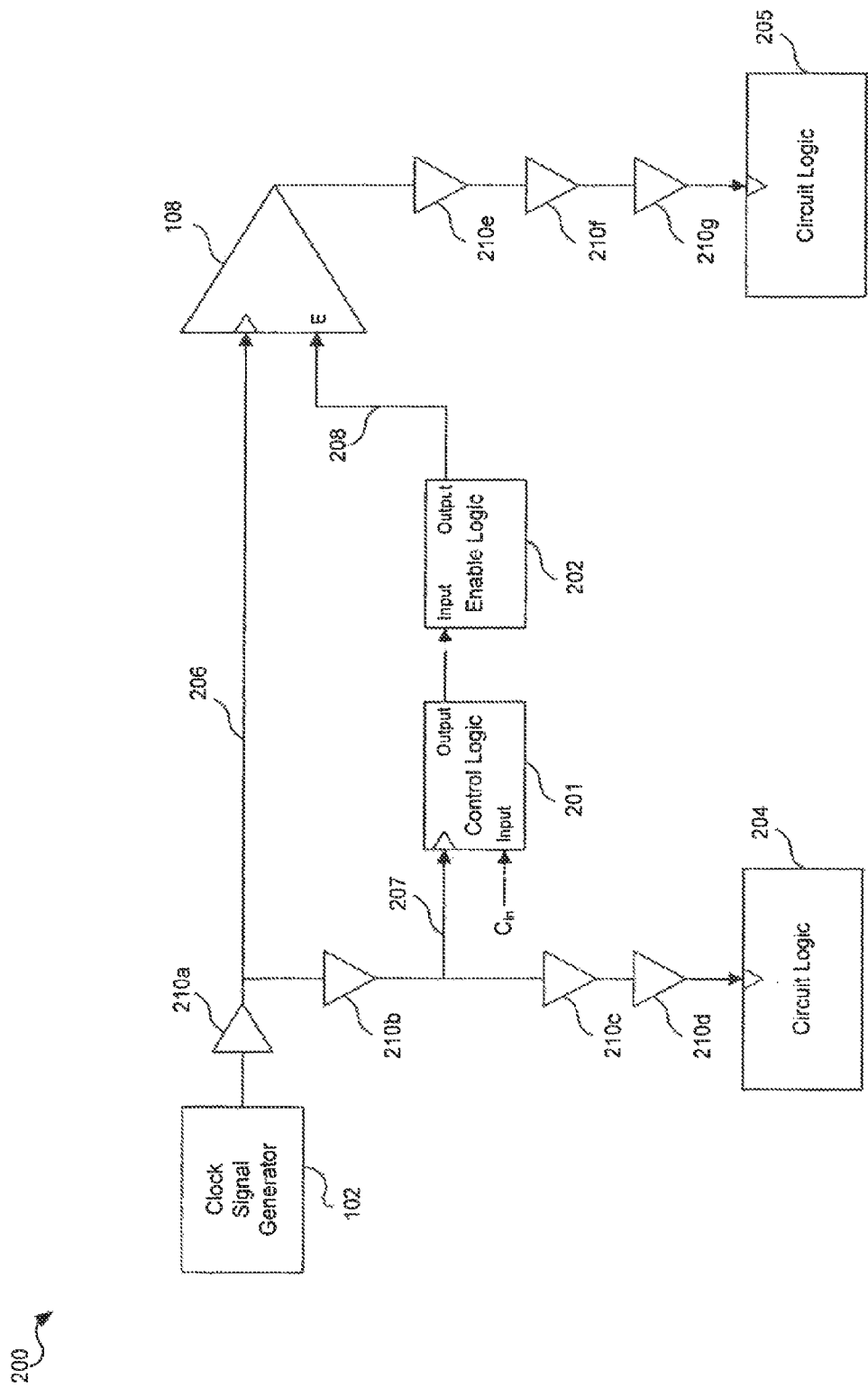
FIG. 2 is a diagram of an example digital circuit designed according to an embodiment of the present invention.

FIG. 2 is a diagram of an exemplary digital circuit 200 according to an embodiment of the present invention. As shown in FIG. 2, digital circuit 200 includes a clock signal generator 102, control logic 201, enable logic 202, a clock gater 108, and two circuit logic blocks 204 and 205. Control logic 201 may receive an input $C_{in}$ and a clock signal 207 from clock signal generator 102. A clock signal generated by clock signal generator 102 may pass though buffers 210a-g in a buffered clock tree such as, for example, the clock tree found in clocking system 100. Enable logic 202 receives an input from control logic 201 and provides a control signal 208 to clock gater 108. Control signal 208 is applied to an enable pin of clock gater 108 to control the output of clock gater 108. When enabled, clock gater 108 allows clock signal 206 to pass through to circuit logic 205. In an embodiment, clock gater 108 can be used to periodically power-down circuit logic block 205 to reduce power consumption and/or heat generation. In an embodiment, control logic 201 and enable logic 202 are a part of power management unit (see, e.g., power management unit 718 in FIG. 7).

Figure 3:
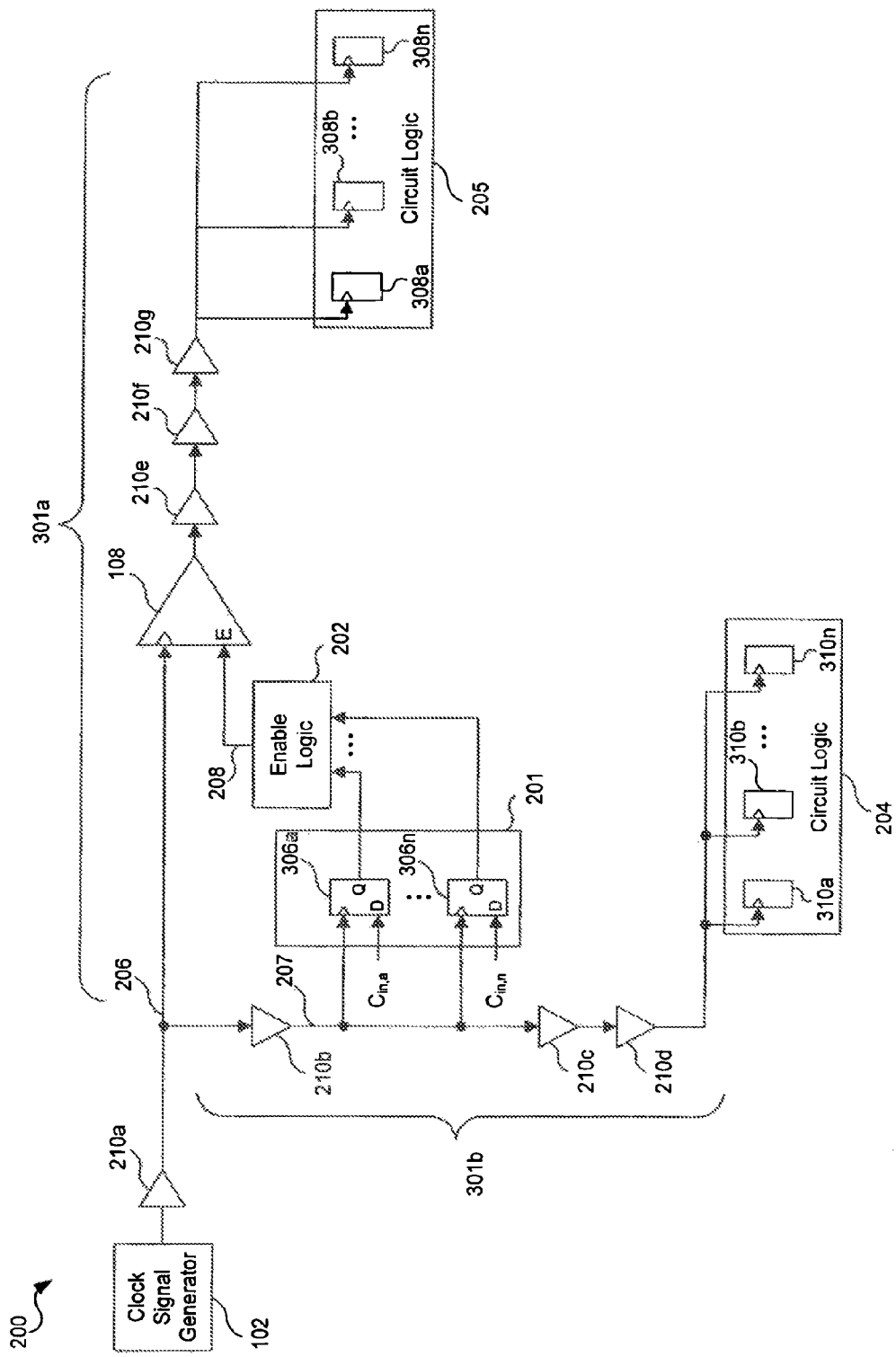
FIG. 3 is a more detailed diagram of an example digital circuit designed according to an embodiment of the present invention.

FIG. 3 is a more detailed diagram of an exemplary digital circuit 200. As shown in FIG. 3, digital circuit 200 includes a buffered clock tree 301. Buffered clock tree 301 may be similar to the clock tee found in clocking system 100. A first branch 301a of clock tree 301 is used to clock registers 308a-n found in digital logic 205. A second branch 301b of clock tree 301 is used to clock registers 310a-n found in digital logic 204. In embodiments, clock tree 301 includes more than just the two branches 301a and 301b illustrated in FIG. 3.

As shown in FIG. 3, branch 301a of clock tree 301 includes clock gater 108 and a plurality of buffers 210e-g. When clock gater 108 is enabled by enable logic 202, clock gater 108 allows clock signal 206 to pass through to registers 308a-n. Buffers 210e-g are used to help propagate clock signal 206 to registers 308a-n.

Branch 301b of clock tree 301 includes a plurality of buffers 210b-d. Buffers 210b-d are used to help propagate clock signal 206 to registers 310a-n. Ideally, registers 310a-n are clocked at approximately the same instance in time as registers 308a-n whenever clock gater 108 is enabled.

As shown in FIG. 3, branch 301b also provides an early clock signal 207 to registers 306a-n in control logic 201. Registers 306a-n receive inputs $C_{in,a \ldots n}$ and provide inputs to enable logic 202, which controls the operation of clock gater 108. As described in more detail below, an early clock signal 207 provided to registers 306a-n reduces and/or eliminates adverse timing constraints imposed by an inherent clock signal skew that exists in digital circuit 200. Clock signal 207 may be generated automatically by the automated design tool. Providing an early clock signal 207 to registers 306a-n allows for an increased clock frequency while still meeting digital circuit 200 timing constraints. In contrast to the present invention, conventional clocking systems and design tools only allow for manual tuning of the digital circuit in order to achieve similar results and eventual synthesis.

In embodiments of the present invention, buffers 210a-g of buffered clock tree 301 can be of similar or different sizes depending on the loads they are driving. The size of each buffer 210a-g determines or is proportional to the clock signal delay associated with each buffer 210a-g. Thus, the clock signal delays can be different for different buffers 210a-g of buffered clock tree 301.

As shown in FIG. 3, how much earlier clock signal 207 is compared to the clock signal provided to the other digital logic blocks 204 and 205 of digital circuit 200 is determined by the clock signal delays associated with buffers 210b-d. For example, if each buffer 210b-d has an associated clock delay of $T_D$ nanoseconds, then clock signal 207 is provided to registers 306a-n $2T_D$ nanoseconds earlier than the clock signal that is provided to registers 310a-n of digital logic block 204. If, however, buffer 210c has an associated clock delay of $\frac{3}{4}T_D$ nanoseconds and buffer 210d has an associated clock delay of $\frac{7}{8}T_D$ nanoseconds, then clock signal 207 is provided to registers 306a-n $1\frac{5}{8}T_D$ nanoseconds earlier than the clock signal that is provided to registers 310a-n of digital logic block 204. Thus, the timing of early clock signal 207 can be adjusted by selecting the point in branch 301b of clock tree 301 from which clock signal 207 is provided (e.g., a point after buffer 210b or a point after buffer 210c) and by varying the size of the various buffers 210b-d (e.g., in order to vary the associated clock delays associated with clock buffers 210b-d). In embodiments, the timing of early clock signal 207 can also be adjusted by varying the length, for example, of the conductor(s) that route early clock signal 207 to registers 306a-n.

In an embodiment, clock signal 207 may reduce and/or eliminate adverse timing constraints due to an inherent clock signal skew because how much earlier clock signal 207 is compared to the clock signals for digital logic blocks 204 and 205 is set dependent on the insertion delay. Insertion delay may be the delay from the output of clock gater 108 to the clock input of registers 308a-n. The smaller the insertion delay is, the less early clock signal 207 will be compared to the clock signals provided to digital logic blocks 204 and 205. The larger the insertion delay is, the earlier clock signal 207 will be compared to the clock signals provided to digital logic blocks 204 and 205.

Figure 4:
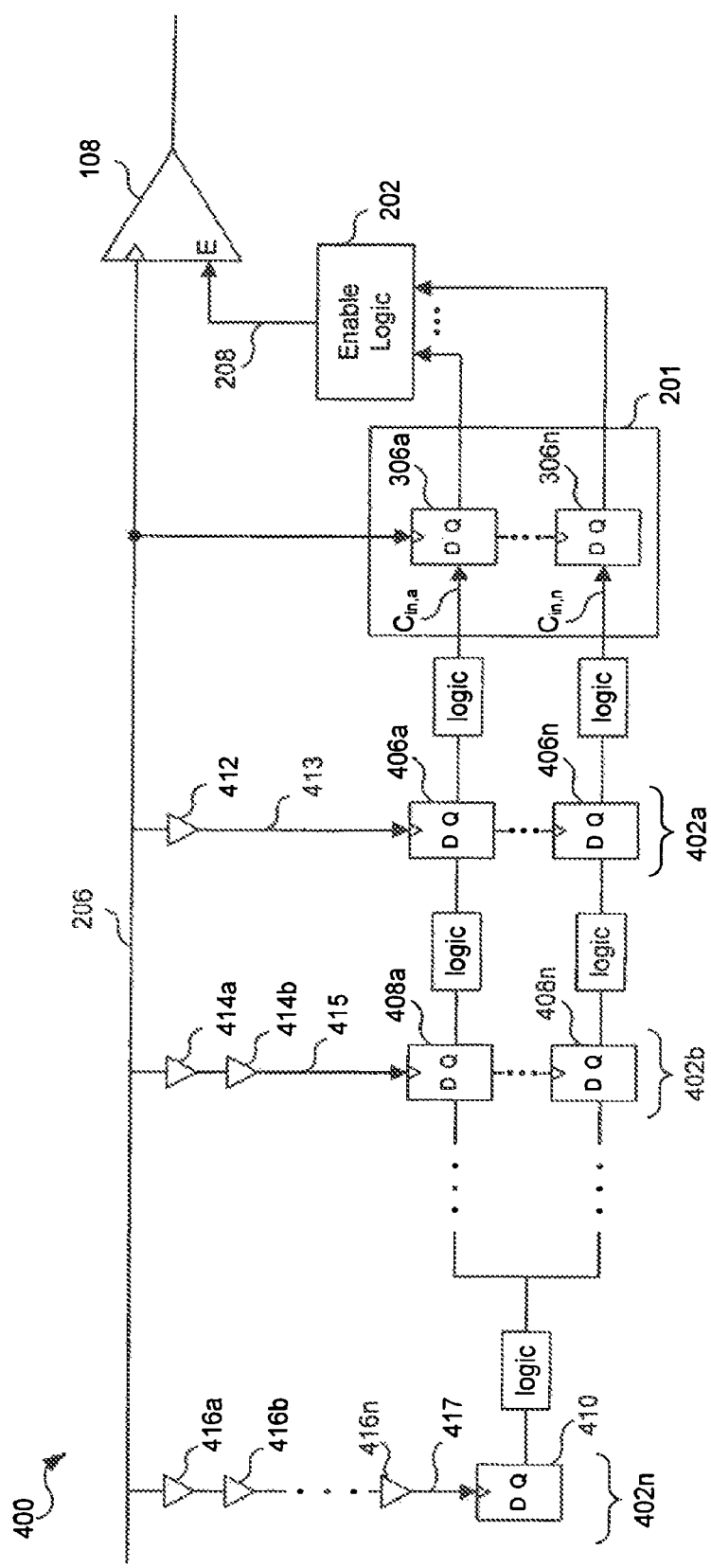
FIG. 4 is a diagram of an example clocking system designed according to an embodiment of the present invention.

FIG. 4 is a diagram of a second example clocking system 400 according to an embodiment of the present invention. As shown in FIG. 4, clocking system 400 includes a clock gater 108, control logic 201, enable logic 202, and a plurality of register stages 402a-n. In an embodiment, control logic 201 may be driven by n-stages that take n-clock cycles to complete. The automated design tool may automatically adjust a clock tree, such as, for example, the clock tree found in clocking system 100, to accommodate these n-stages.

As shown in FIG. 4, register stage 402a includes registers 406a-n. Register stage 402b includes registers 408a-n. Register stage 402n includes register 410. In an embodiment, logic that operates on one or more of the values output by the various registers is located between each of the register stages 402a-n.

Register stages 402a-n illustrate how selected registers can be clocked, using early clock signals determined automatically by the automated design tool, to reduce and/or eliminate adverse timing constraints due to an inherent clock signal skew that exists as a result of including clock gater 108 in the buffered clock tree. Providing an early clock signal to selected registers allows for an increased clock frequency while still meeting digital circuit timing constraints.

As shown in FIG. 4, in an embodiment, registers 306a-n receive clock signal 206 generated by clock signal generator 102 (see, e.g., FIG. 2). This is the earliest clock signal provided to any of the registers because there are no buffers present between clock signal generator 102 and registers 306a-n to delay clock signal 206. Registers 406a-n receive an early clock signal 413. Clock signal 413 is delayed compared to clock signal 206 by an amount of time equal to the time delay associated with buffer 412. Registers 408a-n receive an early clock signal 415. Clock signal 415 is delayed compared to clock signal 206 by an amount of time equal to the time delays associated with buffers 414a-b. Register 410 receives a clock signal 417. Clock signal 417 is delayed compared to clock signal 206 by an amount of time equal to the time delays associated with buffers 416a-n.

The largest timing difference between the clock signals shown in FIG. 4 occurs between clock signal 206, which is provided to registers 306a-n, and clock signal 417, which is provided to register 410. While the timing difference between clock signal 417 and clock signal 206 may be relatively large, the timing differences between any two successive stages are minimal in comparison. Thus, as long as the path between each successive stage meets timing constraints, register stages 402a-n as a whole will meet timing constraints. This is due to the fact that the various stages 402a-n shown in FIG. 4 distribute or allocate the total timing difference into more manageable requirements. Thus, as illustrated by clocking system 400, register 410 (e.g., of indefinite delay) may drive a series of registers 406a-n and 408a-n, which lead to inputs $C_{in,a \ldots n}$ of control logic 201, when the clock signal delay is properly adjusted for each stage.

In an embodiment, the timing of the early clock signals shown in FIG. 4 can be adjusted by the automated design tool by selecting the point in the clock tree branch from which the clock signals are provided (e.g., by selecting a point before or after a particular buffer) and by varying the size of the various buffers (e.g., in order to vary the associated clock delays associated with the buffers), In embodiments, the timing of the early clock signals can also be adjusted by varying the length, for example, of the conductors that route the early clock signals to the registers.

FIG. 5 is a timing diagram 500 that further illustrates operation of example clocking system 400 in FIG. 4. As shown in FIG. 5, four clock signals 502-505 are delayed by varying amounts compared to a first clock signal 501. Clock signal 501 corresponds to an input clock signal, for example, for clock gater 108. The other four clock signals 502-505 correspond to clock signals that have been delayed, for example, due to buffers. Each of the clock signals 502-505 would be provided to a different register stage 402a-n of clocking system 400.

As shown in timing diagram 500, the timing difference $t_1$ between each successive register stage has been evenly distributed. This is not a requirement, however, of the present invention. As will be apparent to one skilled in the art, given the description herein, the timing differences between each stage may be adjusted by the automated design tool according to the logic present in the timing path or other considerations. Without properly distributing the early clock signal among stages, the register stage corresponding to clock signal 505, for example stage 402a, only has time $t_2$ to complete all operations and return a value to control logic 201. By properly distributing the early clock signal among stages, however, the register stage corresponding to clock signal 505, for example stage 402n, has time $t_3$ (e.g., an increase of time $t_4$) to return a value. This extra time $t_4$ gives the digital circuit designer the ability to maintain or increase clock speed, while still achieving the power saving benefits associated with the use of clock gaters.

Figure 6A:
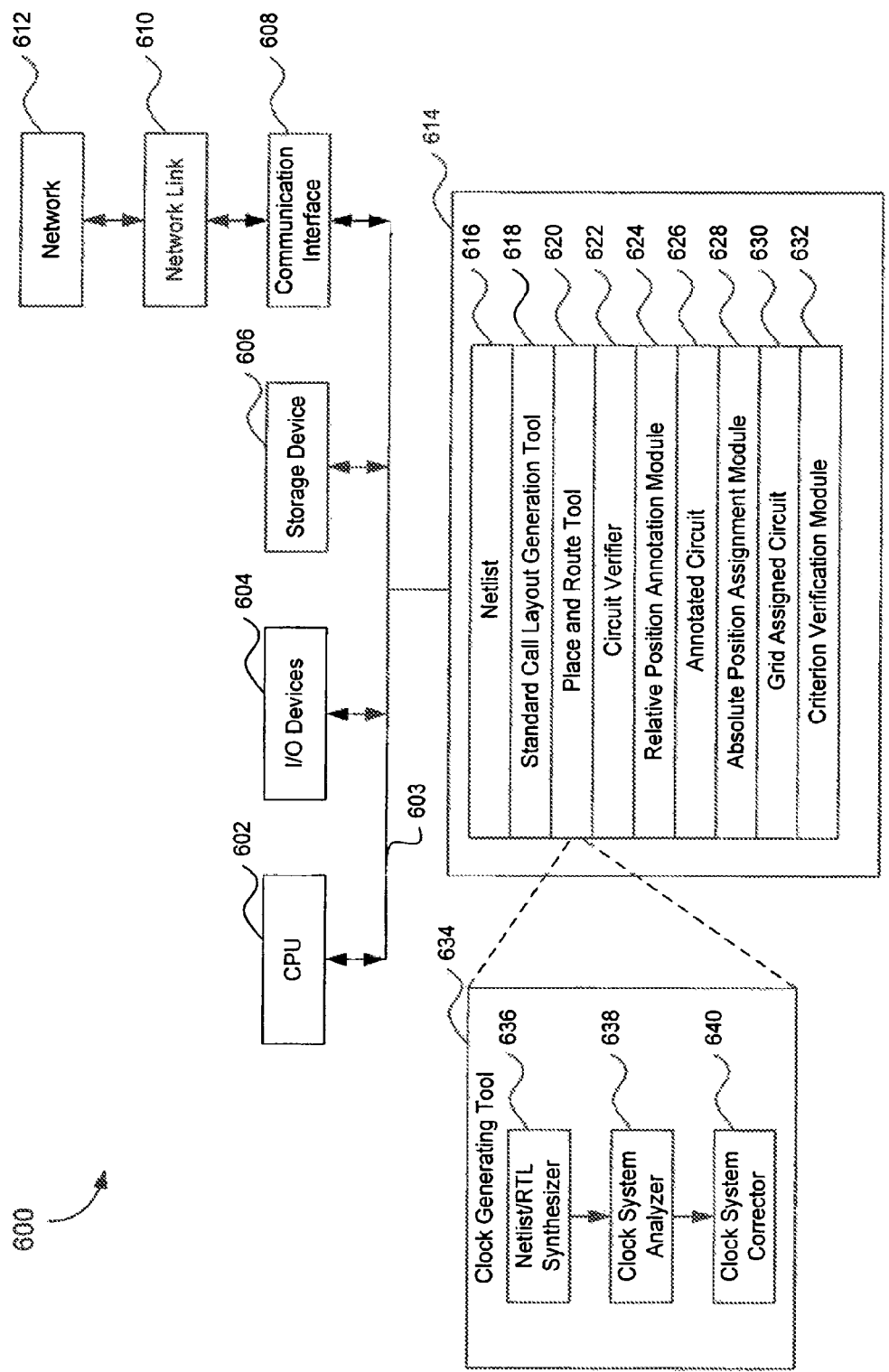
FIG. 6A is a diagram of an automated design tool according to an embodiment of the present invention.

FIG. 6A is a diagram of an automated design tool configured in accordance with an embodiment of the present invention. As shown in FIG. 6A, design tool 600 includes a central processing unit (CPU) 602, input/output devices 604 (such as, for example, a keyboard, a mouse, a display, a printer, etc.), a storage device 606, a communication interface 608, and a memory 614, each connected to a bus 603. In an embodiment, storage device 606 is a permanent storage device that stores executable programs that are subsequently executed from primary memory 614. Communication interface 608 is connected to a network link 610, which is in turn connected to a network 612. The components of design tool 600 noted above are familiar to persons skilled in the relevant art(s) as they form typical elements of a computer.

Executable programs found in memory 614 form a part of design tool 600. In an embodiment, memory 614 stores a netlist 616, a standard cell layout generation tool 618, a place and route tool 620, a circuit verifier 622, a relative position annotation module 624, an annotated circuit 626, an absolute position assignment module 628, a grid assigned circuit 630, and a criteria verification module 632.

As illustrated in FIG. 6A, place and route tool 620 includes a clock generating tool 634. Clock generating tool 634 includes, but is not limited to, a netlist/RTL synthesizer 636, a clock system analyzer 638, and a clock system corrector 640. In an embodiment, netlist/RTL synthesizer 636 converts netlist 616 into a semiconductor circuit layout, where the semiconductor circuit layout specifies the physical implementation of the circuit in silicon or some other semiconductive material. Clock system analyzer 638 identifies components within the semiconductor circuit layout. Clock system corrector 640 makes changes to components within the semiconductor circuit layout to meet and/or fulfill certain requirements such as, for example, timing constraints. In an embodiment, clock system analyzer 638 and clock system corrector 640 perform the functionality of method 650 below.

Figure 6B:
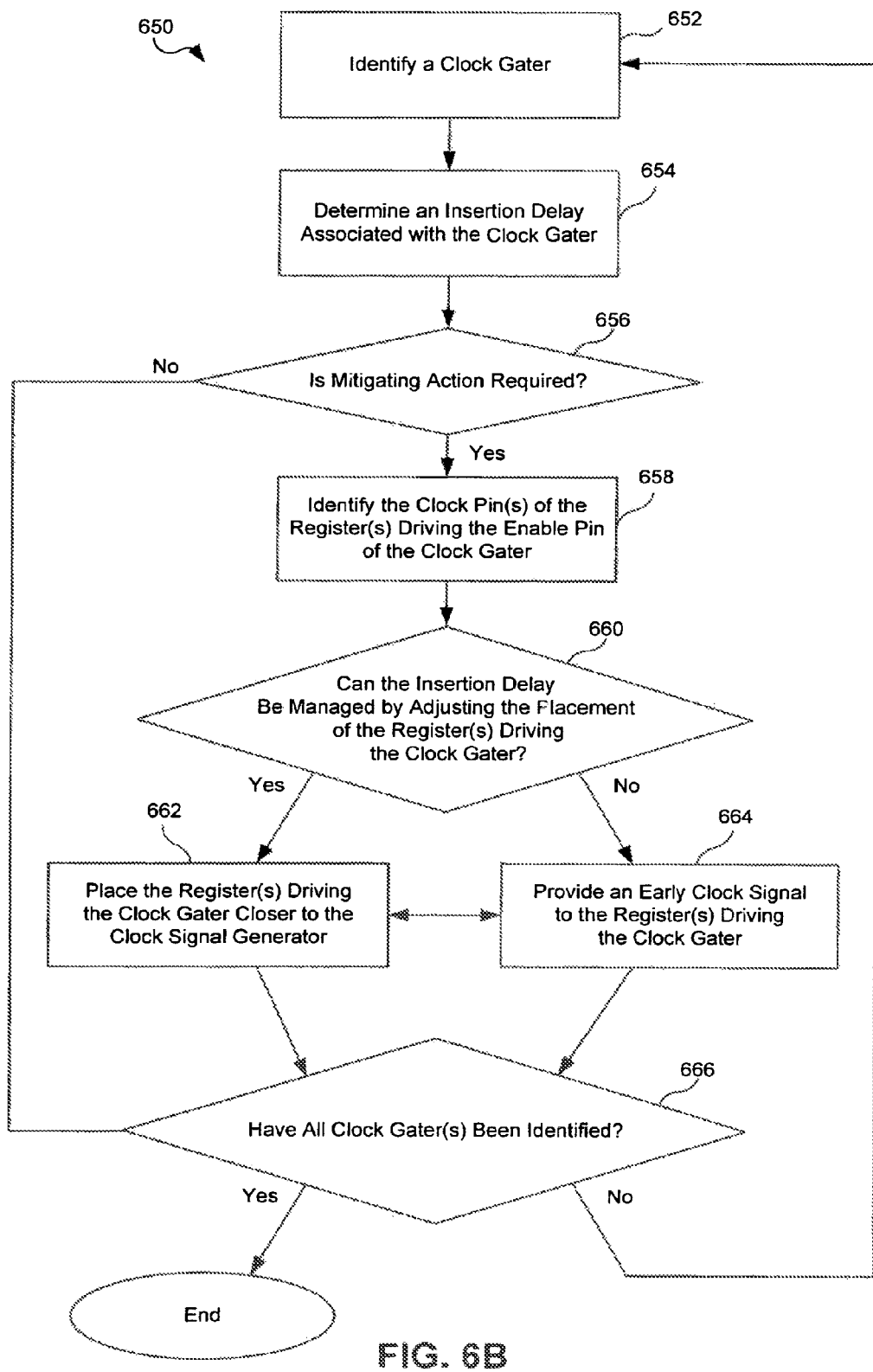
FIG. 6B is a flow chart of an example method embodiment of the present invention.

FIG. 6B is a flow chart of a method 650 for reducing or eliminating inherent clock signal skew in a digital circuit according to an embodiment of the present invention. Method 650 begins at 652.

At 652, a clock gater (e.g., a top or block level clock gater) is identified. In an embodiment, this is performed using software to search a hardware description language (HDL) representation of a digital circuit such as, for example, Verilog HDL or VHDL. A top or block level clock gater can be identified, for example, by summing the total number of registers driven by the clock gater, and if the number of registers is greater than a specified number (e.g., 500), the clock gater is a top or block level clock gater. As another example, a top or block level clock gater can be identified by summing the total number of registers and the number of registers driven by the clock gater, and if the number of registers driven by the clock gater exceeds a specified percentage (e.g., five percent) of the total number of registers, the clock gater is a top or block level clock gater. This step is not limited to identifying top or block level clock gaters, as it may apply to a clock gater at any level. From 652, method 650 proceeds to 654.

At 654, an insertion delay associated with the clock gater identified at 652 is determined. In an embodiment, the associated insertion delay is determined as the delay from the output of the clock gater to the register(s) driven by the clock gater. In embodiments, determining the insertion delay can involve calculating, measuring or estimating a maximum, a minimum, or an average delay. From step 654, method 650 proceeds to step 656.

At 656, a determination is made whether the insertion delay determined at 654 requires mitigating action (e.g., the insertion delay is large compared to the clock period). If mitigating action is required, method 650 proceeds to step 658. Otherwise, method 650 proceeds to step 666.

At 658, the clock pin(s) of register(s) driving the clock gater identified at 652 are identified. As used herein, a register is considered to be driving the clock gater if the register provides a value used to control (e.g., enable or disable) the clock gater (e.g., registers 306a-n in control logic 201 in FIG. 3). In an embodiment, the driving register(s) provide their values to enable logic associated with the clock gater. From 658, method 650 proceeds to 660.

At 660, a determination is made whether the insertion delay determined at 654 can be managed by adjusting the placement of the register(s) driving the clock gater. If the insertion delay can be managed by adjusting the placement of the register(s) driving the clock gater, method 650 proceeds to 662. If the insertion delay cannot be managed by adjusting the placement of the register(s) driving the clock gater, method 650 proceeds to step 664.

At 662, the register(s) driving the clock gater are repositioned in order to reduce adverse timing constraints due to the insertion delay. In certain instances, this approach may be a simple solution and the only mitigating action that is required. However, in other instances, repositioning the register(s) may be undesirable and/or will not solve the timing issue. In these instances, an early clock signal is provided to the register(s). In some instances, it may be desirable to both provide an early clock signal to the register(s) and to reposition the register(s) and/or clock gater. Thus, as shown in FIG. 6B, the operations performed at 662 and 664 are not mutually exclusive, and both may be carried out as mitigating actions. From 662, method 650 proceeds to either 664 or 666.

At 664, the clock tree is modified to provide an early clock signal to the register(s) driving the clock gater. Based on the insertion delay, it can be determined how much earlier the clock signal to the clock gater driving registers needs to be to ensure proper operation at a chosen clock frequency. In an embodiment, the size of one or more buffers may also be adjusted, for example, as part of providing an early clock signal to the register(s) driving the clock gater. Furthermore, as noted above, the operations performed at 662 and 664 are not mutually exclusive, and both may be carried out as mitigating actions. From 664, method 650 proceeds to either 662 or 666.

At 666, a determination is made whether all clock gaters have been identified and evaluated. If there are no additional clock gaters requiring identification/evaluation, method 650 ends. Otherwise, method 650 proceeds to 652.

It is to be noted that the steps of method 650 can be performed in other sequences than that illustrated in FIG. 6B and described above. For example, all the clock gaters can be identified at 652, all the insertion delays for the clock gaters can be determined at 654, etc., such that there is no looping required from step 666 to step 652. As another example, the sequence and/or order of the steps illustrated in FIG. 6B and described above can be rearranged in time (e.g., step 658 may be performed before step 656 or before step 654). Thus, the present invention is not limited by the flowchart of FIG. 6B.

It is also to be noted that embodiments of the present invention such as, for example, method 650 are implemented as one or more software design tools used for designing digital circuits. The software design tool(s) can be executed or implemented using any commercially available and well known computer capable of performing the functions described herein.

Figure 7:
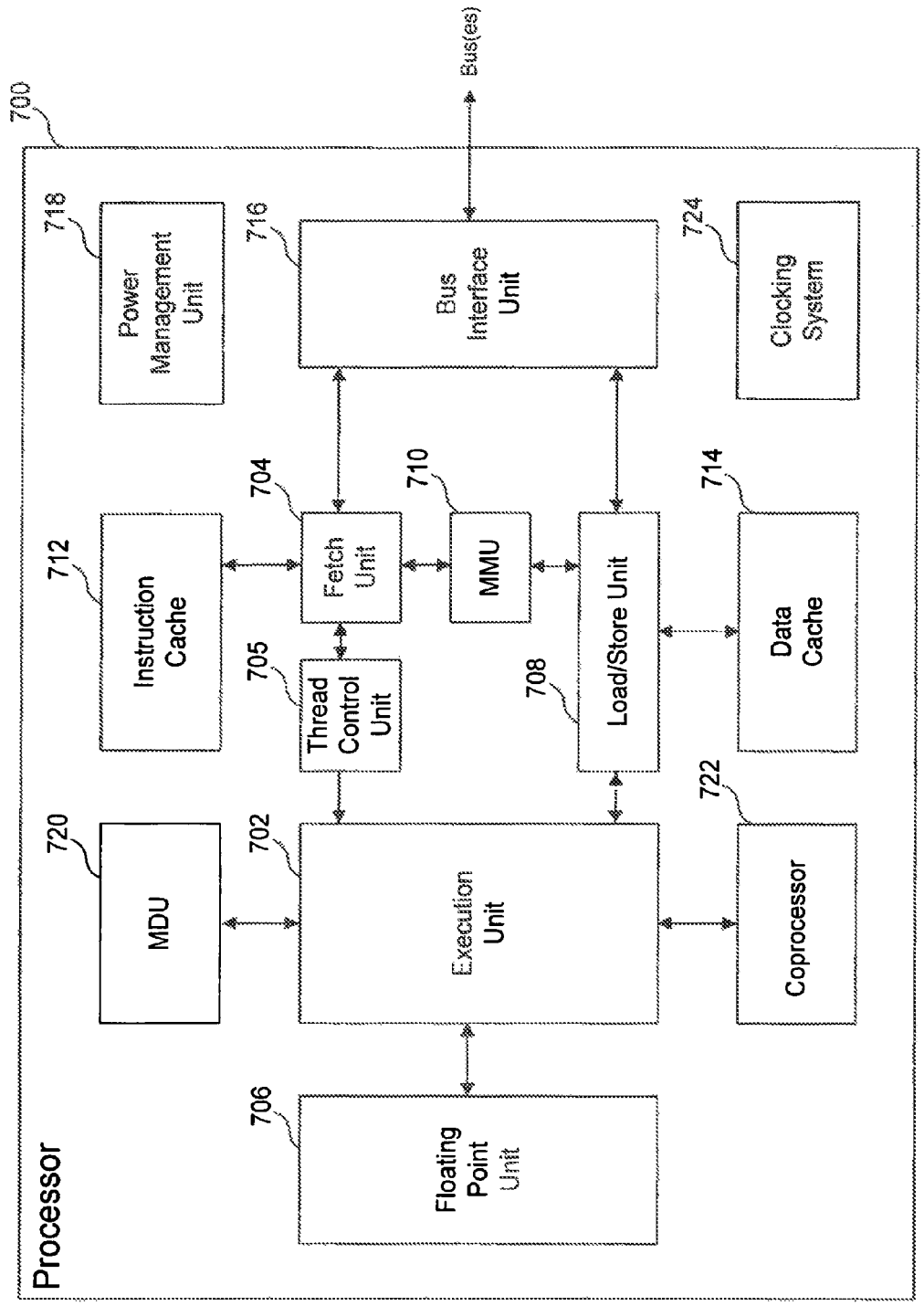
FIG. 7 is a diagram of an example digital circuit that can be designed according to an embodiment of the present invention

FIG. 7 is a diagram of an exemplary digital circuit or processor 700 according to an embodiment of the present invention. As described herein, the present invention can be used to design and implement any digital circuit, for example, that includes a clocking system in which the clock latency through the clock tree is comparable to the clock period of the clocking system. As an example, a high-speed microprocessor is a digital circuit in which the clock latency through the clock tree may be comparable to the clock period of the clocking system. It is to be noted, however, that the present invention is not limited to just processors or processing circuits.

Processor 700 includes an execution unit 702, a fetch unit 704, a thread control unit 705 (e.g., in the case of a multi-threading processor), a floating point unit 706, a load/store unit 708, a memory management unit (MMU) 710, an instruction cache 712, a data cache 714, a bus interface unit 716, a power management unit 718, a multiply/divide unit (MDU) 720, and a coprocessor 722. The design and operation of these elements of processor 700 are known to persons skilled in the relevant art(s). These elements of processor 700 are illustrative and not intended to limit the present invention.

As shown in FIG. 7, processor 700 includes a clocking system 724. Clocking system 724 generates a clock signal that is provided to the various synchronizing elements of processor 700. The clock signal and synchronizing elements are used to maintain synchronization of processor 700.

Figure 8:
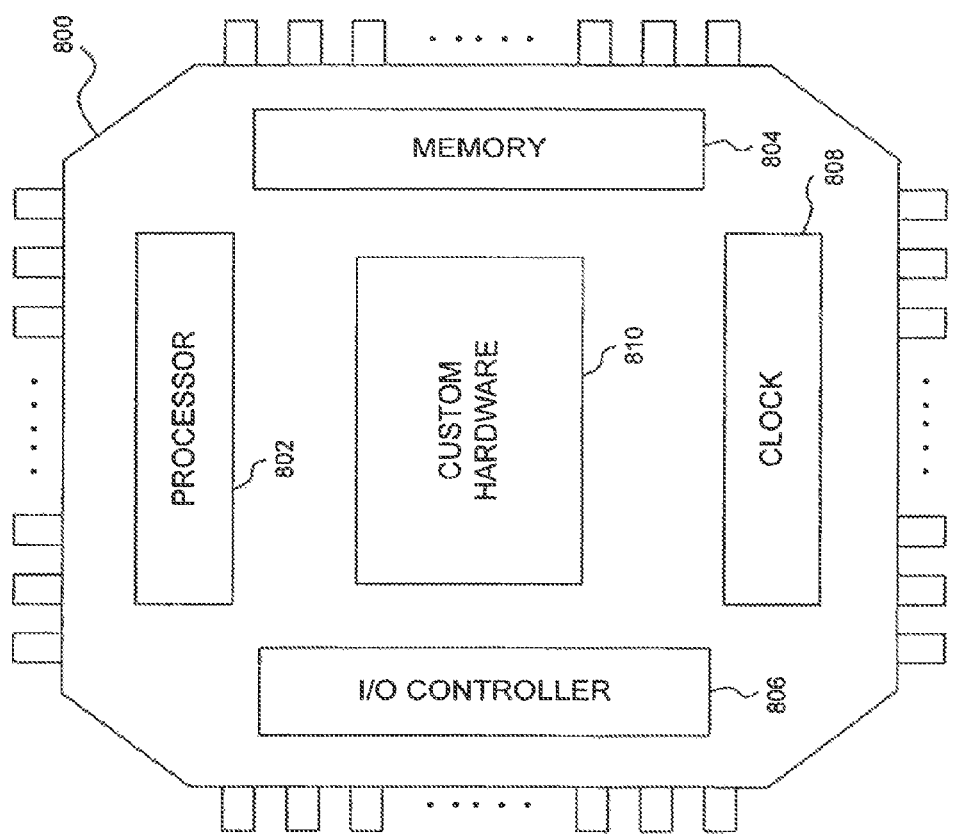
FIG. 8 is a diagram of an example system that can be designed according to an embodiment of the present invention.

FIG. 8 is a diagram of an example system 800 according to an embodiment of the present invention. System 800 includes a processor 802, a memory 804, an input/output (I/O) controller 806, a clock 808, and custom hardware 810. In an embodiment, system 800 is a system on a chip (SOC) in an application specific integrated circuit (ASIC).

Processor 802 is any processor that includes features of the present invention described herein and/or implements a method embodiment of the present invention. In one embodiment, processor 802 includes an instruction fetch unit, an instruction cache, an instruction decode and dispatch unit, one or more instruction execution unit(s), a data cache, a register file, and a bus interface unit similar to processor 700 described above.

Memory 804 can be any memory capable of storing instructions and/or data. Memory 804 can include, for example, random access memory and/or read-only memory.

Input/output (I/O) controller 806 is used to enable components of system 800 to receive and/or send information to peripheral devices. I/O controller 806 can include, for example, an analog-to-digital converter and/or a digital-to-analog converter.

Clock 808 is used to determine when sequential subsystems of system 800 change state. For example, each time a clock signal of clock 808 ticks, state registers of system 800 capture signals generated by combinatorial logic. In an embodiment, the clock signal of clock 808 can be varied. The clock signal can also be divided, for example, before it is provided to selected components of system 800.

Custom hardware 810 is any hardware added to system 800 to tailor system 800 to a specific application. Custom hardware 810 can include, for example, hardware needed to decode audio and/or video signals, accelerate graphics operations, and/or implement a smart sensor. Persons skilled in the relevant arts will understand how to implement custom hardware 810 to tailor system 800 to a specific application.

By decoupling timing characteristics from layout characteristics during place-and-route, an automated design tool is allowed an extra degree of freedom when designing clock trees in complex, high-speed digital circuits. The automated design tool can automatically route early clock signals to select logic elements in order to avoid critical timing paths associated with the use of clock gaters, leading to automatic synthesis without the need for intervention.

While various embodiments of the present invention have been described above, it should be understood that they have been presented by way of example, and not limitation. It will be apparent to persons skilled in the relevant computer arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code and/or instructions disposed in any form, such as source, object or machine language) disposed, for example, in a computer usable (e.g., readable) medium configured to store the software. Such software can enable, for example, the function, fabrication, modeling, simulation, description and/or testing of the embodiments described herein. For example, this can be accomplished through the use of general programming languages (e.g., C, C++), hardware description languages (HDL) including Verilog HDL, VHDL, SystemC Register Transfer Level (RTL), and so on, or other available programs. Such software can be disposed in any known computer usable medium such as, for example, semiconductor, magnetic disk, optical disk (e.g., CD-ROM, DVD-ROM), etc.

It is understood that the embodiments described herein may include or be included in a semiconductor intellectual property core, such as a microprocessor core (e.g., embodied in HDL) and transformed to hardware in the production of integrated circuits. Additionally, the embodiments described herein may be realized as a combination of hardware and software. Thus, the present invention should not be limited by any of the above-described exemplary embodiments, but should be defined only in accordance with the following claims and their equivalence. Furthermore, it should be appreciated that the detailed description of the present invention provided herein, and not the summary and abstract sections, is intended to be used to interpret the claims. The summary and abstract sections may set forth one or more but not all exemplary embodiments of the present invention.

What is claimed is:

1. A digital circuit, comprising:
 a clocking system configured to reduce clock skew;
 a clock gater associated with the clocking system;
 a clock pin associated with a register, wherein the clock pin selectively drives an enable pin of the clock gater; and
 a buffered clock tree configured to provide a selectable early clock signal to the clock pin, of the register,
 wherein the clock gater is identified as a top level clock gater when a number of registers driven by the clock gater, compared to a summing of a total number of registers, exceeds a threshold value.

2. The digital circuit of claim 1, wherein the buffered clock tree is configured to select a number of clock buffers between a clock signal generator and the register.

3. The digital circuit of claim 1, wherein the buffered clock tree is configured to select a size of a clock buffer between a clock signal generator and the register.

4. The digital circuit of claim 1, wherein the buffered clock tree is configured to determine an insertion delay associated with a clock signal output by the clock gater, and provide an early clock signal to the register based on the determined insertion delay.

5. The digital circuit of claim 4, wherein the buffered clock tree is further configured to determine a maximum insertion delay associated with a clock signal output by the clock gater.

6. The digital circuit of claim 4, wherein the buffered clock tree is further configured to determine an average insertion delay associated with a clock signal output by the clock gater.

7. The digital circuit of claim 1, wherein the buffered clock tree is configured to provide:
a first early clock signal to a first plurality of registers belonging to a first clock gater driving register stage; and
a second early clock signal to a second plurality of registers belonging to a second clock gater driving register stage.

* * * * *